(12) United States Patent
McDonnell et al.

(10) Patent No.: US 10,030,877 B2
(45) Date of Patent: Jul. 24, 2018

(54) AIR HANDLER APPARATUSES FOR EVAPORATIVE FLUID COOLING AND METHODS THEREOF

(71) Applicants: Gerald McDonnell, Midlothian, VA (US); Jeffrey Cheesman, Upper Saddle River, NJ (US)

(72) Inventors: Gerald McDonnell, Midlothian, VA (US); Jeffrey Cheesman, Upper Saddle River, NJ (US)

( * ) Notice: Subject to any disclaimer, the term of this patent is extended or adjusted under 35 U.S.C. 154(b) by 0 days.

(21) Appl. No.: 15/046,043

(22) Filed: Feb. 17, 2016

(65) Prior Publication Data
US 2017/0205094 A1    Jul. 20, 2017

Related U.S. Application Data

(63) Continuation-in-part of application No. 14/997,057, filed on Jan. 15, 2016.

(51) Int. Cl.
*F25D 17/06* (2006.01)
*F25D 23/12* (2006.01)
(Continued)

(52) U.S. Cl.
CPC ....... *F24F 5/0035* (2013.01); *H05K 7/20827* (2013.01)

(58) Field of Classification Search
CPC .......... F24F 5/0035; F24F 13/30; F24F 13/20; F24F 3/06; F24F 3/065; F24F 11/06;
(Continued)

(56) References Cited

U.S. PATENT DOCUMENTS 2,796,743 A * 6/1957 McFarlan ............... F24F 5/001
                                                      62/324.1
5,267,451 A * 12/1993 Cleveland ............. F24F 11/027
                                                      165/108
(Continued)

FOREIGN PATENT DOCUMENTS

CN       102213467 A    10/2011
WO    2013106882 A1     7/2013
(Continued)

OTHER PUBLICATIONS

AAON, "Evaporative-Cooled Condenser", The Patented AAON, Sep. 2015, pp. 1-4, www.aaon.com.
(Continued)

*Primary Examiner* — Joseph Trpisovsky
(74) *Attorney, Agent, or Firm* — LeClairRyan PLLC

(57) ABSTRACT

An air handler apparatus includes at least one heat exchanger device with a cooling fluid region separated from a temperature transfer fluid region, an evaporator device comprising an evaporator housing and at least one evaporator coil, and a pump. The cooling fluid region has a cooling fluid input and a cooling fluid output and the temperature transfer fluid region has a temperature transfer fluid input and a temperature transfer fluid output. The evaporator housing defines an air passage having an air input and an air output. The evaporator coil has an evaporator coil input coupled to the temperature transfer fluid output and an evaporator output coupled to temperature transfer fluid input of the temperature transfer fluid region in the heat exchanger device. The pump is coupled to the temperature transfer fluid region in the heat exchanger device to pump temperature transfer fluid between the temperature transfer fluid region and the evaporator coil when activated.

4 Claims, 6 Drawing Sheets

(51) Int. Cl.
*F25D 5/00* (2006.01)
*F25B 7/00* (2006.01)
*F24F 5/00* (2006.01)
*H05K 7/20* (2006.01)

(58) Field of Classification Search
CPC ....... F24F 2001/0092; F25B 7/00; F25B 5/04; F25B 6/04; F25B 2313/0234; F25B 5/02; F25B 39/02; F25B 39/028; F25B 2313/0233; F28D 2021/0071
USPC ........ 62/95, 259.4, 304, 305, 175, 335, 504, 62/515, 519, 524, 525
See application file for complete search history.

(56) References Cited

U.S. PATENT DOCUMENTS

| | | | |
|---|---|---|---|
| 5,424,414 | A | 6/1995 | Mattingly |
| 5,799,725 | A | 9/1998 | Bradley, Jr. et al. |
| 6,062,028 | A | 5/2000 | Arnold et al. |
| 6,101,821 | A | 8/2000 | Cates |
| 6,178,770 | B1 | 1/2001 | Bradley, Jr. et al. |
| 6,315,804 | B1 | 11/2001 | Bradley |
| 6,591,902 | B1 * | 7/2003 | Trent .................. F24F 1/0059 165/104.14 |
| 6,598,862 | B2 | 7/2003 | Merrill et al. |
| 6,889,759 | B2 | 5/2005 | Derosier |
| 6,923,250 | B2 | 8/2005 | Hegg et al. |
| D545,395 | S | 6/2007 | Morgan et al. |
| 7,234,318 | B2 | 6/2007 | Grisler |
| 7,296,620 | B2 | 11/2007 | Bugler, III et al. |
| 7,475,719 | B2 | 1/2009 | Derosier et al. |
| 7,704,364 | B2 | 4/2010 | Merrill et al. |
| 7,765,827 | B2 | 8/2010 | Schlom et al. |
| 8,104,306 | B1 | 1/2012 | Elsner |
| 8,490,422 | B2 | 7/2013 | Al Watban |
| 8,534,083 | B2 | 9/2013 | Austin et al. |
| 8,783,053 | B2 | 7/2014 | McCann |
| 8,974,274 | B2 | 3/2015 | Carlson |
| 9,091,485 | B2 | 7/2015 | Bugler, III et al. |
| 9,772,123 | B2 | 9/2017 | McDonnell et al. |
| 2004/0123608 | A1 * | 7/2004 | Kamimura ............. C09K 5/042 62/114 |
| 2013/0074534 | A1 | 3/2013 | Schneider et al. |
| 2014/0338391 | A1 | 11/2014 | Keisling |

FOREIGN PATENT DOCUMENTS

WO    2014047154 A1    3/2014
WO    WO 2014059054 A1 *    4/2014    ............... F25B 5/04

OTHER PUBLICATIONS

"Energy-Efficient Air Conditioning", Energy Efficiency and Renewable Energy, Jun. 1999, DOE/GO-10099-376, FS 2016, pp. 1-8.
Bourne, D., "Benefits of Retrofiting Dual Evaporative Cooling for RTUs", California Commissioning Collaborative, Jun. 9, 2011, pp. 1-27.
ZECO, "Two Stage Evaporative Cooling", ZECO, Sep. 2015, pp. 1-2, www.zecoair.com.
Gottschalk, K., "Followup from Jun. 26 TECO technical review meeting with Dan Dennis and staff", ChemTreat, Inc., Jul. 31, 2008, pp. 1-14.
TECO, "Chlorine Dioxide Discussion", ChemTreat Inc., Apr. 18, 2011, pp. 1-30.
TECO, "Technical Review Meeting", ChemTreat, Inc., Nov. 18, 2010, pp. 1-33.
Wikipedia, "Chiller", Wikipedia, The Free Encyclopedia, last accessed May 11, 2016.
Office Action for U.S. Appl. No. 15/152,334, pp. 1-4, dated Jul. 20, 2016.
International Search Report for corresponding PCT Patent Application No. PCT/US17/13296, dated Feb. 17, 2017.
International Search Report for corresponding PCT Patent Application No. PCT/US17/13288, dated Feb. 17, 2017.
Gottschalk, K. et al., "Safely Applying Chlorine Dioxide to USC Thermal Energy System", ChemTreat, Inc., Feb. 2013, pp. 1-33.
TECO, "Facts and Figures", Aug. 31, 2016, 2 pages, Retrieved from the Internet: <http://tecothermalenergy.com/about-teco/facts-and-figures/.
Gottschalk, K., "Followup From Jun. 26 TECO Technical Review Meeting With Dan Dennis And Staff.", Jul. 31, 2008, 14 pages.
Chemtreat, Inc., "Teco Chlorine Dioxide Discussion", Apr. 18, 2011, 30 pages.
Chemtreat, Inc., TECO Technical Review Meeting, Nov. 18, 2010, 33 pages.

* cited by examiner

AIR HANDLER APPARATUSES FOR EVAPORATIVE FLUID COOLING AND METHODS THEREOF

This application is a continuation-in-part of prior U.S. patent application Ser. No. 14/997,057, filed Jan. 15, 2016, which is hereby incorporated by reference in its entirety.

FIELD

This technology relates to air handler apparatuses for evaporative fluid cooling and methods thereof.

BACKGROUND

Currently, prior cooling systems in most commercial and data center operations operate with standard flow rates for water as high as over 300 gallons per minute (GPM). Unfortunately, moving this water through these prior cooling systems at these high flow rates does not allow for the absorption of much heat by each gallon of water resulting in only a small difference between the temperature of the water entering and leaving these prior cooling systems resulting in low delta T syndrome. Typically, with low delta T syndrome the flow rate or gallons per minute is high and the temperature difference is low between about ten to twelve degrees and in reality often between about two and ten degrees. As a result of these design issues, these prior cooling systems often work acceptably, but require very significant amounts of energy and maintenance.

To address this issue, prior solutions have tried various combinations of increasing the flow and/or adding more cooling towers. Unfortunately, increasing the flow may again have a negative impact on the amount of temperature drop or delta T which is attainable and thus is not a viable solution. Further, the addition of more cooling towers, related piping, and pumps adds further expense and takes up a greater amount of space, none of which is desirable.

SUMMARY

An air handler apparatus includes at least one heat exchanger device with a cooling fluid region separated from a temperature transfer fluid region, an evaporator device comprising an evaporator housing and at least one evaporator coil, and a pump. The cooling fluid region has a cooling fluid input and a cooling fluid output and the temperature transfer fluid region has a temperature transfer fluid input and a temperature transfer fluid output. The evaporator housing defines an air passage having an air input and an air output. The evaporator coil has an evaporator coil input coupled to the temperature transfer fluid output and an evaporator output coupled to temperature transfer fluid input of the temperature transfer fluid region in the heat exchanger device. The pump is coupled to the temperature transfer fluid region in the heat exchanger device to pump temperature transfer fluid between the temperature transfer fluid region and the evaporator coil when activated.

A method for making an air handler apparatus includes providing at least one heat exchanger device with a cooling fluid region separated from a temperature transfer fluid region. The cooling fluid region has a cooling fluid input and a cooling fluid output and the temperature transfer fluid region has a temperature transfer fluid input and a temperature transfer fluid output. An evaporator device with an evaporator housing and at least one evaporator coil is provided. The evaporator housing defines an air passage having an air input and an air output. The evaporator coil has an evaporator coil input coupled to the temperature transfer fluid output and an evaporator output coupled to temperature transfer fluid input of the temperature transfer fluid region in the heat exchanger device. A pump is coupled to the temperature transfer fluid region in the heat exchanger device to pump temperature transfer fluid between the temperature transfer fluid region and the evaporator coil when activated.

This technology provides a number of advantages including providing more effective and efficient air handler apparatuses for evaporative fluid cooling and methods. In particular, this technology provides air handler apparatuses which are able to assist evaporative fluid cooling apparatuses achieve a high delta T and a low flow rate, i.e. gallons per minute (GPM), that are able to easily avoid low delta syndrome. By way of example, this technology can provide a high delta T of between twenty degrees to forty-five degrees and also a low flow rate or gallons per minute. Additionally, with this high delta T and a low flow rate design, this technology is able to provide a significant reduction, i.e. often in excess of 50%, in the size and cost of piping and other parts when compared against prior cooling systems. Further, with this high delta T and a low flow rate design, this technology is able to output pure, non-saturated air and is able to utilize sprayer water that is chemical free. This technology also allows for a unique phased in integration of the compressor chiller that allow that compression chiller to operate at a greatly reduced lift compared to prior designs thereby lowering kW/ton relationship.

DETAILED DESCRIPTION

Figure 1:
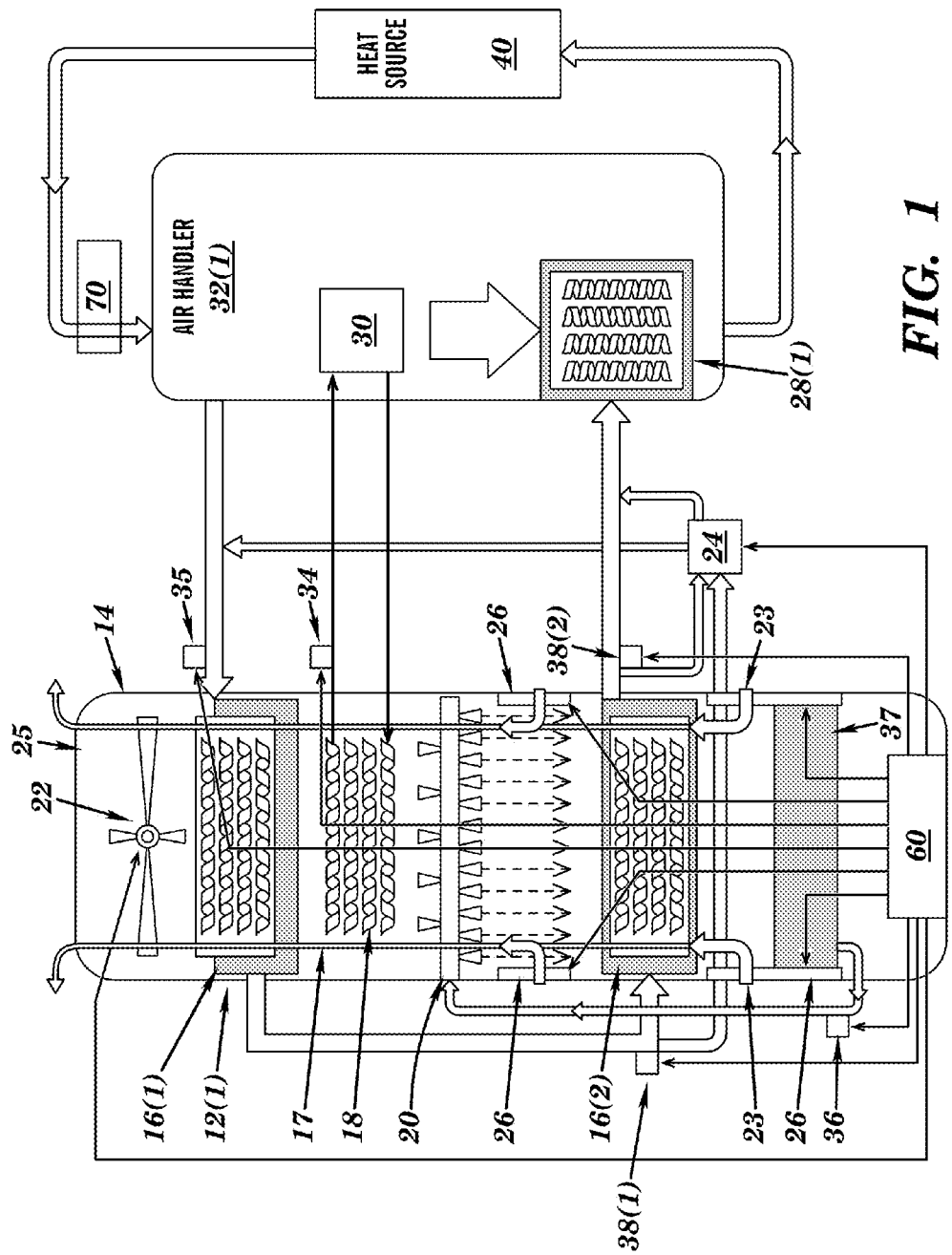
FIG. 1 is a functional block diagram of an example of an environment with an example of an evaporative fluid cooling apparatus with a refrigerant coil.

An environment 10 with an example of an evaporative fluid cooling apparatus 12(1), air handler apparatus 32(1), and heat source 40, such as a building by way of example only, is illustrated in FIG. 1. In this particular example, the evaporative fluid cooling apparatus 12(1) includes a cooling housing 14, at least two fluid coils 16(1)-16(2), an optional refrigerant coil 18, a sprayer apparatus 20, an air movement apparatus 22, an optional compressor chiller 24, and evaporative cooler management computing device 60, although the apparatus could include other types and numbers of systems, devices, components, and/or other elements in other configurations, such as those illustrated in FIGS. 5 and 6 by way of example only. This technology provides a number of advantages including providing more effective and efficient evaporative fluid cooling apparatuses and methods.

The cooling housing 14 has side walls which define a cooling chamber 17 having air input 23 and an air output 25 and provides a supporting structure for the fluid coils 16(1)-16(2), the optional refrigerant coil 18, the sprayer apparatus 20, the air movement apparatus 22, the optional compressor chiller 24, the collection device 37, and the evaporative cooler management computing device 60 of the evaporative fluid cooling apparatus 12(1), although the housing 14 could have other configurations and could provide a supporting structure for other types and/or numbers of other systems, devices, components, and/or other elements.

The cooling housing 14 may also optionally include one or more controllable vents or louvers 26 along one or more side surfaces of the cooling housing 14, although the housing 14 could provide other types and/or numbers of adjustable access points. In this particular example, the controllable vents or louvers 26 are each constructed to at least have a closed position to seal a corresponding opening in the cooling housing 14 and an open position which can be managed by the controller. In the open position, the vents or louvers 26 provide a passage to allow the introduction of fresh, cool and dryer outside air to enter the cooling chamber 17 and pass between one or more of the fluid coils 16(1)-16(2) and/or the optional refrigerant coil 18 to increase the free cooling effects, further reducing the need to engage and also the possible load on the compressor chiller 24 when engaged.

Each of the controllable vents or louvers 26 may have a controller comprising a processor, a memory, a communication interface which are coupled together by a bus or other communication link, although other types and/or numbers of other systems, device, components, and/or other elements in other configurations could be used and/or other approaches for managing the operation of the controllable vents or louvers 26 may be used. Each of the controllers in the controllable vents or louvers 26 may be coupled to receive, respond to and/or execute instructions from the evaporative cooler management computing device 60 to move the controllable vents or louvers 26 between open and closed positions using one or more electromechanical control devices, although the operation of the controllable vents or louvers 26 may be managed in other manners, such as manually by way of example only, and may be configured to perform other types and/or numbers of other operations.

The fluid coils 16(1)-16(2) each comprise heat transfer working fluid conduits with one of the fluid coils 16(1) having an input that is configured to be coupled to a return of cooling fluid, an output of the fluid coil 16(1) is coupled to an input of the fluid coil 16(2), although other types and/or numbers of fluid coils in other configurations may be used. The fluid coil 16(1) which receives the initial return of the heated fluid from the air handler apparatus 32(1) is located in the cooling housing 14 adjacent the air output 25. The fluid coil 16(2) which receives the fluid from the fluid coil 16(1) is located adjacent the air inputs 23 in the cooling housing 14. Accordingly, with this configuration to receive fluid in the fluid coil 16(1) adjacent the air output 25 of the cooling housing 14 and then to further cool and return fluid to the fluid coil 16(2) adjacent the air input 23 of the cooling housing 14 is in an inverse with respect to the absorption of heat from the fluid in the fluid coils 16(1)-16(2) in the cooling housing 14 based on a direction of air flow from the one or more air inputs 23 to the air output 25. As a result, with this configuration heated fluid from the air handler apparatus 32(1) may now be transported to the fluid coils 16(1)-16(2) in the evaporative fluid cooling apparatus 12(1) at lower volumes than possible with prior designs because the heated fluid carries more heat energy per unit volume.

In particular, with this example when the heated fluid enters the fluid coil 16(1) adjacent the air output 25 of the cooling housing 14, the heated fluid in the fluid coil 16(1) will be exposed to cool wet air that has already been cooled and supersaturated by the second coil 16(2) adjacent the air inputs 23 and through evaporative cooling of spray water from the sprayer apparatus 20 to nearly the wet bulb temperature in the atmosphere. When the cool wet air hits the fluid coil 16(1), it absorbs heat, and by the time it exits the cooling housing 14 at the air output 25, it is at or warm enough that it has more than enough space for the water it has absorbed and also eliminates plumes. At the same time the fluid in the fluid coil 16(1) is cooled, so that by the time it enters the fluid coil 16(2) less cooling is required to reach nearly the wet bulb temperature. As a result, this example of the technology essentially provides free cooling all the way up to a wet bulb of about 60 degrees Fahrenheit or an ambient temperature of about 80 degrees without needing to engage the compressor chiller 24 and also provides other benefits, such as substantial savings in energy, a high delta T and a low required flow rate for the fluid from the air handler apparatus 32(1) by way of example.

An example of the benefits of this high delta T and low flow rate design with this technology resulting in reduced requirements for the fluid coils 16(1)-16(2) and related piping is set forth below. Again as noted earlier, this technology is able to utilize a high delta T of between twenty degrees to forty-five degrees and also a low flow rate or gallons per minute. Additionally, the formula for calculating a ton is (GPM×8.33)×Delta T=BTU. Accordingly, assuming a delta T of thirty five degrees, an example of the decrease in flow requirements is set forth below:

(100 GPM×8.33)×10=8,330 BTU (50 GPM×8.33)×35=14,577 BTU

As illustrated above, the lower GPM with the higher delta T, e.g. thirty-five degrees in this example, in accordance with an example of this technology when compared against a prior cooling system with a low delta T of ten which is typical for prior systems has the higher BTU. Accordingly, by using this technology a significant reduction in size and cost, i.e. purchase and installation, as well as a reduction in tonnage demands on the chiller can be achieved.

A fluid pump 35 may be coupled to the piping to the fluid coil 16(1), although the fluid pump may be in other locations and other types and/or numbers of fluid movement devices maybe used. The fluid pump 35 may have a controller comprising a processor, a memory, a communication interface which are coupled together by a bus or other communication link, although other types and/or numbers of other systems, device, components, and/or other elements in other configurations could be used and/or other approaches for managing the operation of the fluid pump 34 may be used. The controller in the fluid pump 35 may be coupled to receive, respond to and/or execute instructions from the evaporative cooler management computing device 60 to manage the engagement of and rate of pumping of the cooling fluid through the loop from the fluid coils 16(1)-16(2) and out to the air handler apparatus 32(1) and back, although the operation of the fluid pump 35 may be managed in other manners, such as manually by way of example only and may be configured to perform other types and/or numbers of other operations.

With this low flow rate design, this technology is able to utilize a much smaller, less expensive, and more energy efficient fluid pump 35 than possible with prior evaporative cooling system. Additionally, with this low flow rate design this technology is able to use much thinner fluid coils 16(1)-16(2) and connecting pipes than prior cooling evaporative fluid cooling systems which provides a significant reduction in size and cost. Further, the ability to use much thinner fluid coils 16(1)-16(2) with this technology when compared to prior cooling systems enables air to more easily flow from the air inputs 23 through the fluid coils 16(1)-16(2) in the cooling chamber 17 to the air output 25 reducing the size and required power for the air movement apparatus 22.

The optional refrigerant coil 18 comprises another heat transfer conduit and has an input that is configured to be coupled to a return from a refrigerant system 30 and an output that is configured to be coupled to a supply from the refrigerant system 30, although other types and/or numbers of refrigerant coils coupled to other types and/or numbers of sources could be used. In this particular example, the refrigerant system 30 is positioned in the air handler apparatus 32(1) to remove a significant amount of heat prior to the air reaching a heat exchanger device 28(1) in the air handler apparatus 32(1), to provide additional cooling.

A refrigerant pump 34 may be coupled to the piping between the optional refrigerant coil 18 and the refrigerant system 30, although the refrigerant pump 34 may be in other locations and other types and/or numbers of fluid movement devices maybe used. In this particular example, the refrigerant pump 34 is a frictionless magnetic bearings type pump which as result is oil free and thus more efficient and lower maintenance, although other types of pumps could be used, such as a pump with sealed bearings unit that does not require oil in the refrigerant. Using an oil free refrigerant pump 34 provides advantages because oil is an insulator and as result does not take heat, but does take up volume which greatly reducing the efficiency of the refrigerant fluid, increasing efficiency by up to 20%.

The refrigerant pump 34 may have a controller comprising a processor, a memory, a communication interface which are coupled together by a bus or other communication link, although other types and/or numbers of other systems, device, components, and/or other elements in other configurations could be used and/or other approaches for managing the operation of the refrigerant pump 34 may be used. The controller in the refrigerant pump 34 may be coupled to receive, respond to and/or execute instructions from the evaporative cooler management computing device 60 to manage the engagement of and rate of pumping of the refrigerant fluid through the loop from between the optional refrigerant coil 18 and the refrigerant system 30, although the operation of the refrigerant pump 34 may be managed in other manners, such as manually by way of example only and may be configured to perform other types and/or numbers of other operations.

The sprayer apparatus 20 may include a sprayer pump 36 with a controller, piping, and a plurality of nozzles oriented to spray a fluid, such as water by way of example only, on and positioned above the fluid coil 16(2) and below the optional refrigerant coil 18 and the fluid coil 16(2) to cool the air in the cooling chamber 17 via evaporative cooling, although the sprayer apparatus 20 could be positioned in other locations and/or to spray on other devices, such as the fluid coil 16(1) by way of example only. Any non-evaporated water or other fluid that was sprayed drips down into a collection device 37 and may be pumped by the sprayer pump 36 back to the nozzles until evaporated.

The sprayer pump 36 may have a controller comprising a processor, a memory, a communication interface which are coupled together by a bus or other communication link, although other types and/or numbers of other systems, device, components, and/or other elements in other configurations could be used and/or other approaches for managing the operation of the sprayer pump 36 may be used. The controller in the sprayer pump 36 may be coupled to receive, respond to and/or execute instructions from the evaporative cooler management computing device 60 to manage the engagement of and rate of pumping of the spray fluid through the loop from between the sprayer apparatus 20 and the collection device 37, although the operation of the sprayer pump 36 may be managed in other manners, such as manually by way of example only and may be configured to perform other types and/or numbers of other operations.

The air movement apparatus 22, such as a fan by way of example only, is connected at the top of the cooling housing 14 and when activated generates a flow of air through the cooling chamber 17 from the one or more air inputs 23 through the cooling chamber 17 and out the air output 25, although other types and/or numbers of air movement apparatuses in other locations could be used. The air movement apparatus 22 may have a controller comprising a processor, a memory, a communication interface which are coupled together by a bus or other communication link, although other types and/or numbers of other systems, device, components, and/or other elements in other configurations could be used and/or other approaches for managing the operation of the sprayer pump 36 may be used. The controller in the air movement apparatus 22 may be coupled to receive, respond to and/or execute instructions from the evaporative cooler management computing device 60 to manage the engagement of and rate air flow from the one or more air inputs 23 through the cooling chamber 17 and out the air output 25, although the operation of the air movement apparatus 22 may be managed in other manners, such as manually by way of example only and may be configured to perform other types and/or numbers of other operations.

Figure 2:
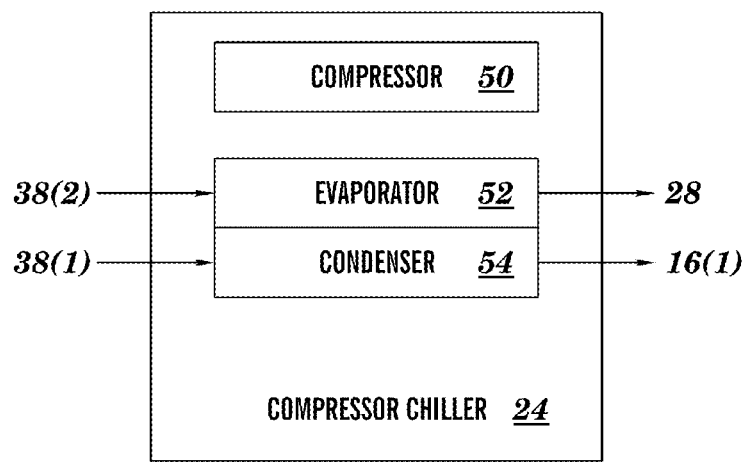
FIG. 2 is a block diagram of an example of the compressor chiller illustrated in FIG. 1.
Figure 3:
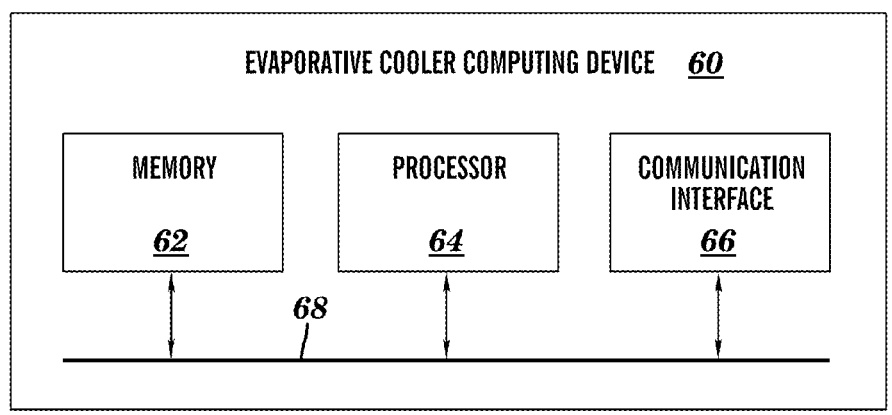
FIG. 3 is a block diagram of an example of an evaporative cooler management computing device illustrated in FIG. 1.
Figure 4:
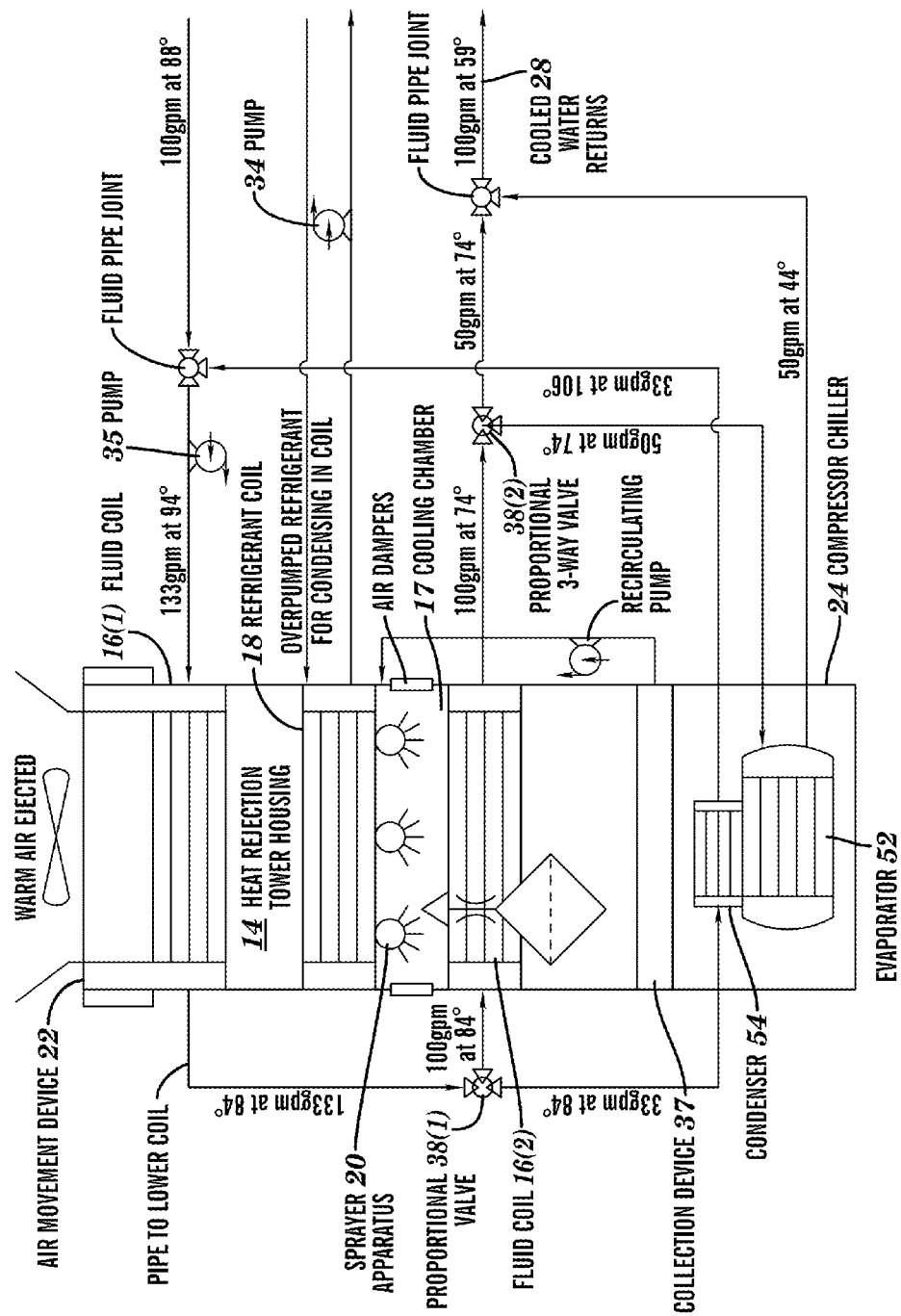
FIG. 4 is a functional block diagram of an example of operating the evaporative fluid cooling apparatus with the refrigerant coil illustrated in FIG. 1.

Referring to FIGS. 1 and 2, the optional compressor chiller 24 has a first compressor chiller input coupled to an output of the fluid coil 16(1), a second compressor chiller input coupled to an output of the fluid coil 16(2), a first compressor chiller output coupled to the input of the fluid coil 16(1), and a second compressor chiller output configured to be coupled to the fluid supply to the one or more air handler device 32. The compressor chiller 24 is a physical compressor 50 that compresses a refrigerant fluid to allow it to create cold in an evaporator 52, the heat removed from the cooling fluid, such as water by way of example, into the refrigerant fluid is transferred back into the cooling fluid returning back to the input of the fluid coil 16(1) via the condenser 54. During warmer weather, such as a temperature above a wet bulb of about 60 degrees Fahrenheit or an ambient temperature of about 80 degrees, the compressor 50 in the compressor chiller 24 mounted below or next to the cooling housing 14 may be engaged to remove a percentage of the cooling fluid from the output of the fluid coil 16(2), uses compressed refrigerant fluid to cool some of that cooling fluid in order to cool a percentage of that cooling fluid, and then combines it with the other cooling fluid from the output of the fluid coil 16(2) for return to the heat exchange device 28(1) in air handler apparatus 32(1) so as to effectively deliver the desired temperature of return cooling fluid. Meanwhile, the heat removed by the refrigerant fluid is moved into the remaining cooling fluid taken and, as noted above, is routed back to the input to the fluid coil 16(1) of the cooling housing 14 to combine with the heated cooling fluid coming back from the air handler apparatus 32(1) for heat rejection.

The optional compressor chiller 24 may have a controller comprising a processor, a memory, a communication interface which are coupled together by a bus or other communication link, although other types and/or numbers of other systems, device, components, and/or other elements in other configurations could be used and/or other approaches for managing the operation of the optional compressor chiller 24 may be used. The controller in the optional compressor chiller 24 may be coupled to receive, respond to and/or execute instructions from the evaporative cooler management computing device 60 to manage the engagement of and rate of operation of the optional compressor chiller 24, although the operation of the optional compressor chiller 24 may be managed in other manners, such as manually by way of example only and may be configured to perform other types and/or numbers of other operations.

A first coil diverter valve apparatus 38(1) may be adjusted to divert the flow of the cooling fluid and has a first coil diverter valve input coupled to an output of the fluid coil 16(1), a first coil diverter valve output coupled to an input to the fluid coil 16(2), and a second coil diverter valve output coupled to an input to the optional compressor chiller 24, although other manners for diverting the flow of the cooling fluid can be used. A second coil diverter valve apparatus valve 38(2) has a first second coil diverter valve input coupled to the output of the fluid coil 16(2), a first coil diverter valve output coupled to an input of the optional compressor chiller 24, and a second coil diverter valve output configured to be coupled to the fluid supply to the air handler apparatus device 32. In this example, first coil diverter valve apparatus 38(1) and the second coil diverter valve apparatus valve 38(2) are uniquely positioned inside this example of the design to allow the compressor chiller 24 to operate at a much lower lift than possible with prior designs therefore lowering kw\ton even in extreme atmosphere conditions.

Each of the first coil diverter valve apparatus 38(1) and the second coil diverter valve apparatus valve 38(2) may have a controller comprising a processor, a memory, a communication interface which are coupled together by a bus or other communication link, although other types and/or numbers of other systems, device, components, and/or other elements in other configurations could be used and/or other approaches for managing the operation of the first coil diverter valve apparatus 38(1) and the second coil diverter valve apparatus valve 38(2) may be used. Each of the controllers in the first coil diverter valve apparatus 38(1) and the second coil diverter valve apparatus valve 38(2) may be coupled to receive, respond to and/or execute instructions from the evaporative cooler management computing device 60 to move the first coil diverter valve apparatus 38(1) and the second coil diverter valve apparatus valve 38(2) between open and closed positions using one or more electromechanical control devices to control an amount of the cooling fluid which is diverted, although the operation of the first coil diverter valve apparatus 38(1) and/or the second coil diverter valve apparatus valve 38(2) may be managed in other manners, such as manually by way of example only, and may be configured perform other types and/or numbers of operations The evaporative cooler management computing device 60 includes a processor 62, a memory 64, and a communication interface 66 which are coupled together by a bus 68 or other communication link, although the evaporative cooler management computing device 60 may include other types and/or numbers of elements in other configurations.

The processor 62 of the evaporative cooler management computing device 60 may execute one or more computer-executable instructions stored in the memory 64 for the methods illustrated and described with reference to the examples herein, although the processor can execute other types and/or numbers of programmed instructions and may be configured to be capable of performing other types and/or numbers of operations. The processor 60 in the evaporative cooler management computing device 60 may comprise one or more central processing units ("CPUs") or general purpose processors with one or more processing cores, although other types of processor(s) could be used.

The memory 64 of the evaporative cooler management computing device 60 stores these programmed instructions for one or more aspects of the present technology as described and illustrated by way of the examples herein, although some or all of the programmed instructions could be stored and executed elsewhere. A variety of different types of memory storage devices, such as random access memory (RAM), read only memory (ROM), hard disk drives, solid state drives, or other computer readable media which is read from and written to by a magnetic, optical, or other reading and writing system that is coupled to the processor 62, can be used for the memory 64.

The communication interface 66 operatively couples and communicates between the evaporative cooler management computing device 60 and a controller for each of the air movement apparatus 22, the compressor chiller 24, the controllable vents 26, the refrigerant pump 34, the fluid pump 35, and the coil diverter valve apparatuses 38(1) and 38(2) which are all coupled together by one or more communication networks, although other types and/or numbers of communication networks or systems with other types and numbers of connections and configurations to other devices and elements. By way of example only, the one or more communication networks can use TCP/IP over Ethernet and industry-standard protocols, including NFS, CIFS, SOAP, XML, LDAP, and SNMP, although other types and numbers of communication networks, can be used.

In this example, an air handler apparatus 32(1) with one or more heat exchangers 28(1) may have an optional dampening device 70 coupled to an input from a cooling loop with a heat source 40, such as a building by way of example only, and another cooling loop with the evaporative fluid cooling apparatus 12(1), although the evaporative fluid cooling apparatus 12(1) could be coupled to other types and/or numbers of other systems in other manners. If the air handler apparatus 32(1) has more than one heat exchanger, the heat exchanger device 28(1) adjacent the input to the air handler apparatus 32(1) may use a refrigerant fluid with a different boiling point than another heat exchanger device 28(1) near an output from the air handler apparatus 32(1). The optional dampening device 70 may have a controller comprising a processor, a memory, a communication interface which are coupled together by a bus or other communication link, although other types and/or numbers of other systems, device, components, and/or other elements in other configurations could be used and/or other approaches for managing the operation of the dampening device 70 may be used. The controller in the optional dampening device 70 may be coupled to receive, respond to and/or execute instructions from the evaporative cooler management computing device 60 to manage and optimize operation of the dampening device 70, although the operation of the optional compressor chiller 24 may be managed in other manners, such as manually by way of example only and may be configured to perform other types and/or numbers of other operations. The air handler apparatus 32(1) may also have the refrigerant system 30 in the return air flow from the heat source 40, although the air handler apparatus may have other types and/or numbers of other systems, devices, components and/or other elements in other configurations.

The evaporative cooler management computing device 60 may be coupled to send, respond to and/or execute one or more programmed instructions for managing the operation of one or more of the controllers for the air movement apparatus 22, the optional compressor chiller 24, the controllable vents or louvers 26, the refrigerant pump 34, the fluid pump 35, the sprayer pump 36, and the first coil diverter valve apparatus 38(1) and the second coil diverter valve apparatus valve 38(2) to react to the changing environment and changing load requirements of the heat source 40, such as a building by way of example only, and these controls may be based on input data and/or based on one or more characteristics, such as current outside temperature or current fluid temperature by way of example only. As the outdoor temperature increases, the evaporative cooler management computing device 60 may have programmed instructions to automatically increase fan speed of the air movement apparatus 22, then to start the sprayer pump 36, and then adjust the rate of cooling fluid to the compressor chiller 24 and engage the operation of the compressor chiller 24 in small increments, and only to the point necessary to achieve the desired exiting cooling fluid temperature. The evaporative cooler management computing device 60 may also have programmed instructions to adjust the opening of the controllable vents or louvers 26, the engagement of and rate of refrigerant pumped by the refrigerant pump 34, and/or the rate of cooling fluid being pumped fluid pump 35 to achieve the desired exiting cooling fluid temperature. Since the evaporative cooler management computing device 60 may be located in the same unit as the fluid coils 16(1)-16(2) and/or and the chiller compressor 24 which may be in or outside the cooling chamber 17, it will instantly react to changes during the day, may have programmed instructions and prior stored operation data to predict the needs in the near future and adapt to each variable as they change to operate the unit in the most efficient way possible.

Although the exemplary environment 10 with evaporative fluid cooling apparatus 12(1) which has the evaporative cooler management computing device 60 and the controllers for the air movement apparatus 22, the optional compressor chiller 24, the controllable vents or louvers 26, the refrigerant pump 34, the fluid pump 35, the sprayer pump 36, and the first coil diverter valve apparatus 38(1) and the second coil diverter valve apparatus valve 38(2) are described and illustrated herein, other types and numbers of systems, devices, components, and/or elements in other topologies can be used. It is to be understood that the systems of the examples described herein are for exemplary purposes, as many variations of the specific hardware and software used to implement the examples are possible, as will be appreciated by those skilled in the relevant art(s).

In addition, two or more computing systems or devices can be substituted for any one of the systems or devices in any example. Accordingly, principles and advantages of distributed processing, such as redundancy and replication also can be implemented, as desired, to increase the robustness and performance of the devices and systems of the examples. The examples may also be implemented on computer system(s) that extend across any suitable network using any suitable interface mechanisms and traffic technologies, including by way of example only teletraffic in any suitable form (e.g., voice and modem), wireless traffic media, wireless traffic networks, cellular traffic networks, G3 traffic networks, Public Switched Telephone Network (PSTNs), Packet Data Networks (PDNs), the Internet, intranets, and combinations thereof.

The examples may also be embodied as one or more non-transitory computer readable media having instructions stored thereon for one or more aspects of the present technology as described and illustrated by way of the examples herein, as described herein, which when executed by a processor, cause the processor to carry out the steps necessary to implement the methods of the examples, as described and illustrated herein.

An example of a method for using an evaporative cooler apparatus 12(1) will now be described with reference to FIGS. 1-4. In this particular example, the optional dampening device 70 may be adjusted by the evaporative cooler management computing device 60 based on at least one characteristic, such as outside air temperature by way of example only, to provide the appropriate mix of outside air with returning air from the heat source 40, such as a building by way of example only, to the air handler apparatus 32(1), although other manner for managing the air supplied to the air handler apparatus 32(1) can be used. Meanwhile, cooling fluid in the heat exchanger device 28(1) in the air handler apparatus 32(1) is continuously managed by the evaporative cooler apparatus 12(1) to ensure maximum heat absorption at exit from the heat exchanger device 28(1) back to the heat source 40.

To manage this cooling fluid, a fluid pump 35 in the evaporative cooler apparatus 12(1) when activated and the rate of operation is controlled by the evaporative cooler management computing device 60 based on at least one characteristic, such as desired temperature by way of example only, pumps the cooling fluid in the pipes through the fluid coil 16(1) adjacent the air output 25 in the cooling chamber 17 and then through the fluid coil 16(2) adjacent the one or more air inputs 23 in the cooling chamber 17, although other types and/or numbers of fluid movement devices in other locations may be used. Accordingly as discussed earlier, this configuration to receive fluid in the fluid coil 16(1) adjacent the air output 25 of the cooling housing 14 and then to further cool and return fluid to the fluid coil 16(2) adjacent the air input 23 of the cooling housing 14 is in an inverse with respect to the absorption of heat from the fluid in the fluid coils 16(1)-16(2) in the cooling housing 14 based on a direction of air flow from the one or more air inputs 23 to the air output 25. As a result, with this configuration heated fluid from the air handler apparatus 32(1) may now be transported to the fluid coils 16(1)-16(2) in the evaporative fluid cooling apparatus 12(1) at lower volumes than possible with prior designs because the heated fluid carries more heat energy per unit volume.

In this particular example, when activated, cooling fluid, such as cooling fluid having a flow rate of 100 GPM and a temperature of 88 degrees in this example, containing heat from the heat exchangers 28(1) air handler apparatus 32(1) is received. This cooling fluid may be combined with heated cooling fluid from the optional compressor chiller 24, when activated and managed by the evaporative cooler management computing device 60 based on at least one characteristic, such as fluid temperature by way of example only, via one of the outputs from the second coil diverter valve apparatus valve 38(2) also activated and managed by the evaporative cooler management computing device 60, to provide in this example cooling fluid having a flow rate of 133 GPM at a temperature of 94 degrees to an input of the fluid coil 16(1). This cooling fluid having a flow rate of 133 GPM at a temperature of 94 degrees enters the fluid coil 16(1) in the cooling chamber 17 adjacent the air output 25 and transfers as much heat energy in the cooling fluid as possible to the atmosphere and then exits as cooling fluid having a flow rate of 133 GPM at a temperature of 84 degrees in this example via an output from the fluid coil 16(1). Accordingly, in this example through reheating cooled air coming up the cooling chamber 17 from the fluid coil 16(2), the cooling fluid in fluid coil 16(1) is precooled for the fluid coil 16(2).

In this example, this cooling fluid descends to an input of the first coil diverter valve apparatus valve 38(1) activated and managed by the evaporative cooler management computing device 60 and which has a first output to divert an adjustable portion of the cooling fluid, in this example cooling fluid having a flow rate of 100 GPM at a temperature of 84 degrees, to an input of the fluid coil 16(2) adjacent air inputs 23 in the cooling chamber 17 and a second output to divert an adjustable portion of the cooling fluid, in this example cooling fluid having a flow rate of 33 GPM at a temperature of 84 degrees, to the optional compressor chiller 24. In this example, until a wet bulb of about 60 degrees Fahrenheit or an ambient temperature of about 80 degrees is reached, the first coil diverter valve apparatus valve 38(1) would not divert any cooling fluid to the compressor chiller 24, although the diversion of cooling fluid to the compressor chiller 24 by the first coil diverter valve apparatus valve 38(1) can be at other stored temperatures.

The precooled cooling fluid enters the fluid coil 16(2) which transfers as much heat energy as possible in the cooling fluid to the atmosphere in the cooling chamber 17. Spray water from the sprayer apparatus 20 at a rate adjusted and managed by the evaporative cooler management computing device 60 assists with this heat transfer through vaporization. The cooling fluid then exits the fluid coil 16(2) in this example as cooling fluid having a flow rate of at 100 GPM at a temperature of 74 degrees, via an output from the fluid coil 16(2) to an input of the second coil diverter valve apparatus valve 38(2). The operation of how much if any cooling fluid is diverted by the second coil diverter valve apparatus valve 38(2) is managed by the evaporative cooler management computing device 60 based on at least one characteristic, such as one or more temperature readings by way of example only. Again, in this example until a wet bulb of about 60 degrees Fahrenheit or an ambient temperature of about 80 degrees is reached, the second coil diverter valve apparatus valve 38(1) would not divert any cooling fluid to the compressor chiller 24, although the diversion of cooling fluid to the compressor chiller 24 by the first coil diverter valve apparatus valve 38(1) can be at other stored temperatures. In this particular example, the second coil diverter valve apparatus valve 38(2) has a first output that is configured to provide cooling fluid having a flow rate of 67 GPM at a temperature of 74 degrees is diverted to the piping towards the heat exchanger device 28(1) and a second output is coupled to provide another adjustable portion of this cooling fluid, in this particular example cooling fluid having a flow rate of 33 GPM at a temperature of 74 degrees to the compressor chiller 24.

Accordingly, in this example as described above when the heated cooling fluid enters the fluid coil 16(1) adjacent the air output 25 of the cooling housing 14, the heated cooling fluid in the fluid coil 16(1) will be exposed to cool wet air that has already been cooled and supersaturated by the second coil 16(2) adjacent the air inputs 23 and through evaporative cooling of spray water from the sprayer apparatus 20 at a rate adjusted and managed by the evaporative cooler management computing device 60 to nearly the wet bulb temperature in the atmosphere. When the cool wet air hits the fluid coil 16(1) by activation and management of the rate of operation of the air movement device 22 by the evaporative cooler management computing device 60 based on at least one characteristic, such as outside air temperature by way of example only, to provide and manage an air flow rate from the one or more air inputs 23 to the air output 25, the flowing air in the cooling chamber 17 absorbs heat, and by the time it exits the cooling housing 14 at the air output 25, it is at or warm enough that it has more than enough space for the water it has absorbed and also eliminates plumes. By the time the cooling fluid in the fluid coil 16(1) enters the fluid coil 16(2), less cooling is required to reach nearly the wet bulb temperature. As a result, this example of the technology essentially provides free cooling all the way up to a wet bulb of about 60 degrees Fahrenheit or an ambient temperature of about 80 degrees without needing to engage the compressor chiller 24 and also provides other benefits, such as substantial savings in energy, a high delta T and a low required flow rate for the fluid from the air handler apparatus 32(1) by way of example. The optional vents or louvers 26 may also be activated and managed by the evaporative cooler management computing device 60 based on at least one characteristic, such as outside air temperature by way of example only, to be adjusted to different open positions to provide additional air flow into the cooling chamber 17

In this example, above the temperatures noted above, the optional compressor chiller 24 may be activated and managed by the evaporative cooler management computing device 60 to cool an adjustable portion of the received cooling fluid based on at least one characteristic, such as fluid temperature by way of example only. In particular, in this example cooling fluid having a flow rate of 33 GPM at a temperature of 62 degrees, and which is then combined with the cooling fluid having a flow rate of 67 GPM at a temperature of 74 degrees. This cooling fluid having a flow rate of 100 GPM at a temperature of 70 degrees is then provided to the supply to the air handler apparatus 32(1). Additionally, the other adjustable portion of the received cooling fluid, in this particular example cooling fluid having a flow rate of 33 GPM at a temperature of 96 degrees, which is being used to transfer the extracted heat from the other cooling fluid in the compressor chiller 24 just described above, is provided back to the input to the fluid coil 16(1) as described earlier.

Additionally, the evaporative fluid cooling apparatus 12(1) may have refrigerant fluid that enters an input of the optional refrigerant coil 18 when a refrigerant pump 34 is activated and managed by the evaporative cooler management computing device 60 and transfers as much heat energy in the refrigerant fluid as possible to the atmosphere and then exits via an output to refrigerant system 30 integrated with the air handler apparatus 32(1) in the building 40 to complete the loop.

Figure 5:
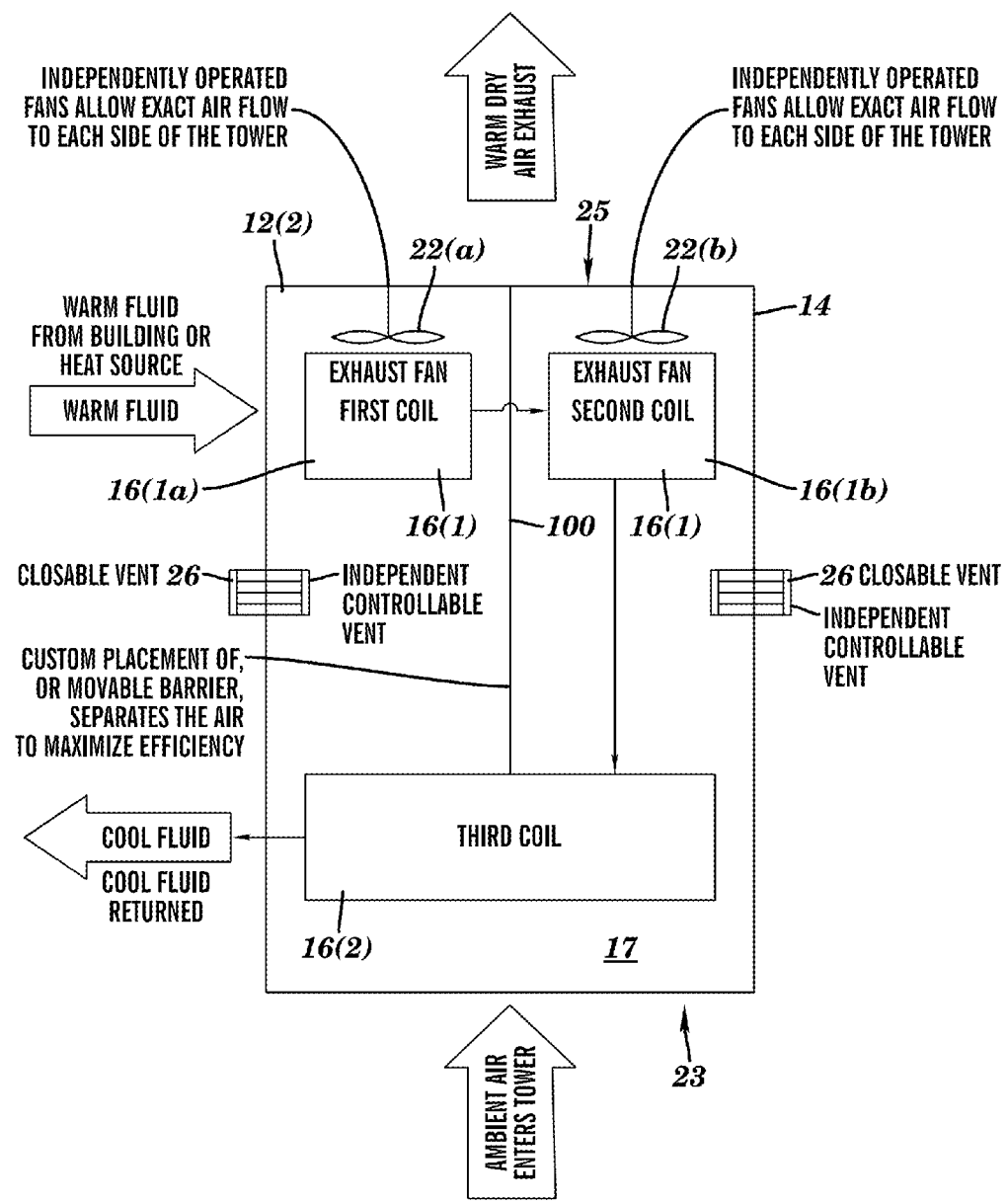
FIG. 5 is functional block diagram of an example of another evaporative fluid cooling apparatus with a split fluid coil and housing.

Referring to FIG. 5, an example of another evaporative fluid cooling apparatus 12(2) is illustrated. The evaporative fluid cooling apparatus 12(2) is the same in structure and operation as the evaporative fluid cooling apparatus 12(1), except as illustrated and described herein. Elements in the evaporative fluid cooling apparatus 12(2) which are like those in evaporative fluid cooling apparatus 12(1) have like reference numerals.

In this example, the housing 14 in the evaporative fluid cooling apparatus 12(2) includes a moveable barrier 100 which may be adjustably positioned in the housing 14 to divide a portion of the cooling chamber 17 into two separate regions which permit air flow between the air input 23 and the air output 25, although the cooling chamber 17 can be divided in other manners and other proportions. The fluid coil 16(1) in the evaporative fluid cooling apparatus 12(2) comprises two separate fluid coils 16(1a) and 16(1b) which are coupled in series with each of the fluid 16(1a) and 16(1b) positioned to extend across at least a portion of one of the regions in the cooling chamber 17, although the fluid coil 16(1) may comprises other numbers of fluid coils in other configurations. The air movement device 22 comprises two separate air movement device 22(a) and 22(b) which are each positioned adjacent the air output 25 in one of the regions in the cooling chamber 17, although the air movement device 22 may comprises other numbers of air movement devices in other configurations and locations. The two separate air movement device 22(a) and 22(b) may each be controlled separately by the evaporative cooler computing device 60 to generate a flow of air through the cooling chamber 17 from the one or more air inputs 23 through the cooling chamber 17 and out the air output 25, although the air movement device 22(a) and 22(b) may each be controlled in other manners. One of the controllable vents or louvers 26 is positioned in the housing 14 to provide controlled access to one of the regions in the cooling chamber 17, although other types and/or numbers of controllable vents or louvres could be used. The sprayer apparatus 20 in the evaporative fluid cooling apparatus 12(2) may be controlled by the evaporative cooler computing device 60 based on at least one characteristic, such as outside air temperature by way of example only, to spray in only one of the regions in the cooling chamber 17 on the outlet side to supply the cooled fluid back to heat exchanger device 28(1) in the air handler apparatus 32(1), although the sprayer apparatus 20 could be configured to spray in the regions in the cooling chamber 17 in other manners and/or patterns.

As noted earlier, the operation of the evaporative fluid cooling apparatus 12(2) is the same as described earlier with reference to the evaporative fluid cooling apparatus 12(1), except in this example separate top coils, a center divider and separate exhaust fans allow for more precise control over the cooling operation. As a result, this advantageously provides substantial water savings as it will require less water to achieve the same cooling, as well as reasonable other cost savings.

Figure 6:
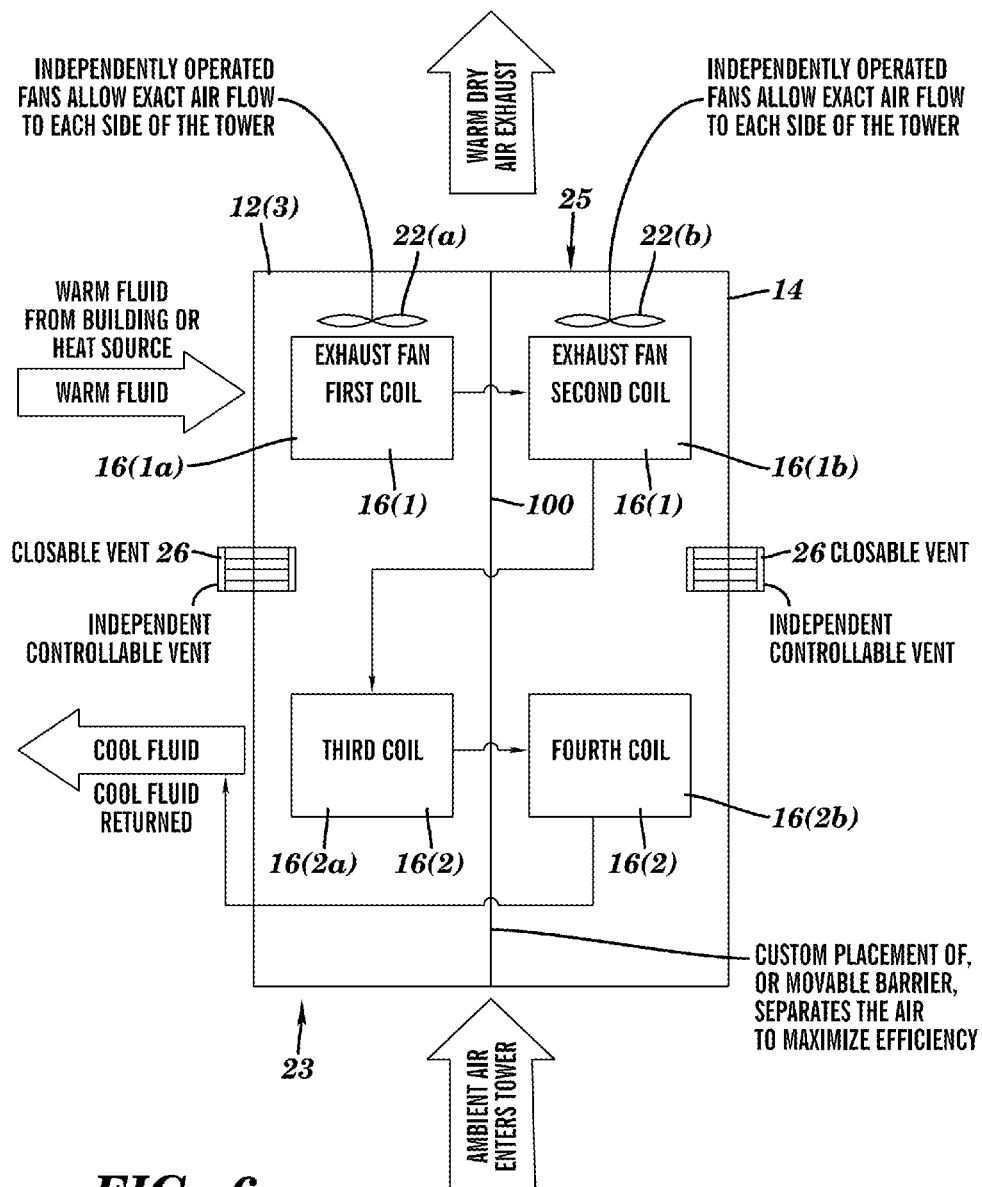
FIG. 6 is functional block diagram of an example of yet another evaporative fluid cooling apparatus with a dual split fluid coil and housing.

Referring to FIG. 6 an example of another evaporative fluid cooling apparatus 12(3) is illustrated. The evaporative fluid cooling apparatus 12(3) is the same in structure and operation as the evaporative fluid cooling apparatuses 12(1) and 12(2), except as illustrated and described herein. Elements in the evaporative fluid cooling apparatus 12(3) which are like those in evaporative fluid cooling apparatuses 12(1) and 12(2) have like reference numerals.

In this example, the housing 14 in the evaporative fluid cooling apparatus 12(3) includes a moveable barrier 100 which may be adjustably positioned in the housing 14 to divide the cooling chamber 17 into two separate regions and which permit air flow between the air input 23 and the air output 25, although the cooling chamber 17 can be divided in other manners and other proportions. The fluid coil 16(1) in the evaporative fluid cooling apparatus 12(3) comprises two separate fluid coils 16(1a) and 16(1b) which are coupled in series with each of the fluid 16(1a) and 16(1b) positioned to extend across at least a portion of one of the regions in the cooling chamber 17, although the fluid coil 16(1) may comprises other numbers of fluid coils in other configurations. The fluid coil 16(2) in the evaporative fluid cooling apparatus 12(3) comprises two separate fluid coils 16(2a) and 16(2b) which are coupled in series with each of the fluid 16(2a) and 16(2b) positioned to extend across at least a portion of one of the regions in the cooling chamber 17, although the fluid coil 16(2) may comprises other numbers of fluid coils in other configurations. In this example, the output from the fluid coil 16(1b) is coupled to the input of fluid coil (2a) so that fluid coils 16(1a), 16(1b), 16(2a), and 16(2b) are coupled in series and in this example form a "Z" shape The air movement device 22 comprises two separate air movement device 22(a) and 22(b) which are each positioned adjacent the air output 25 in one of the regions in the cooling chamber 17, although the air movement device 22 may comprises other numbers of air movement devices in other configurations and locations. The two separate air movement device 22(a) and 22(b) may each be controlled separately by the evaporative cooler computing device 60 based on at least one characteristic, such as outside air temperature by way of example only, to generate a flow of air through the cooling chamber 17 from the one or more air inputs 23 through the cooling chamber 17 and out the air output 25, although the air movement devices 22(a) and 22(b) may each be controlled in other manners. One of the controllable vents or louvers 26 is positioned in the housing 14 to provide controlled access to one of the regions in the cooling chamber 17, although other types and/or numbers of controllable vents or louvres could be used. The sprayer apparatus 20 in the evaporative fluid cooling apparatus 12(2) may be controlled by the evaporative cooler computing device 60 based on at least one characteristic, such as outside air temperature by way of example only, to spray in only one of the regions in the cooling chamber 17 on the outlet side to supply the cooled fluid back to heat exchanger device 28(1) in the air handler apparatus 32(1), although the sprayer apparatus 20 could be configured to spray in the regions in the cooling chamber 17 in other manners and/or patterns.

As noted earlier, the operation of the evaporative fluid cooling apparatus 12(3) is the same as described earlier with reference to the evaporative fluid cooling apparatus 12(1), except in this example separate top and bottom coils, a center divider and separate exhaust fans allow for even more precise control over the cooling operation than in previous examples. In 12(3) the separation into two separate airflow sides allows warmer air to move on the left in the example (the right side top fluid coil 16(1b) feeds fluid to the left side bottom fluid coil 16(2a) so the warmer top and bottom fluid coils 16(1a) and 16(2a) are on the left, cooler fluid coils 16(1b) and 16(2b) on the right, creating a "Z" type arrangement of fluid movement) and cooler air on the right, at air flow generated by air movement devices 22(a) and 22(b) and sprayer rates provided by the sprayer apparatus 20 which are each individually managed and controlled by the evaporative cooler management computing device 60 to maximize efficiency, allowing very precise control over the operation of the tower. As a result, this advantageously provides even greater water savings with evaporative fluid cooling apparatus 12(3) than with evaporative fluid cooling apparatus 12(2) by way of example, providing substantial water savings over standard designs, while further reducing other costs, all in savings should well exceed 5% over the evaporative fluid cooling apparatus 12(3) in many environments.

Figure 7:
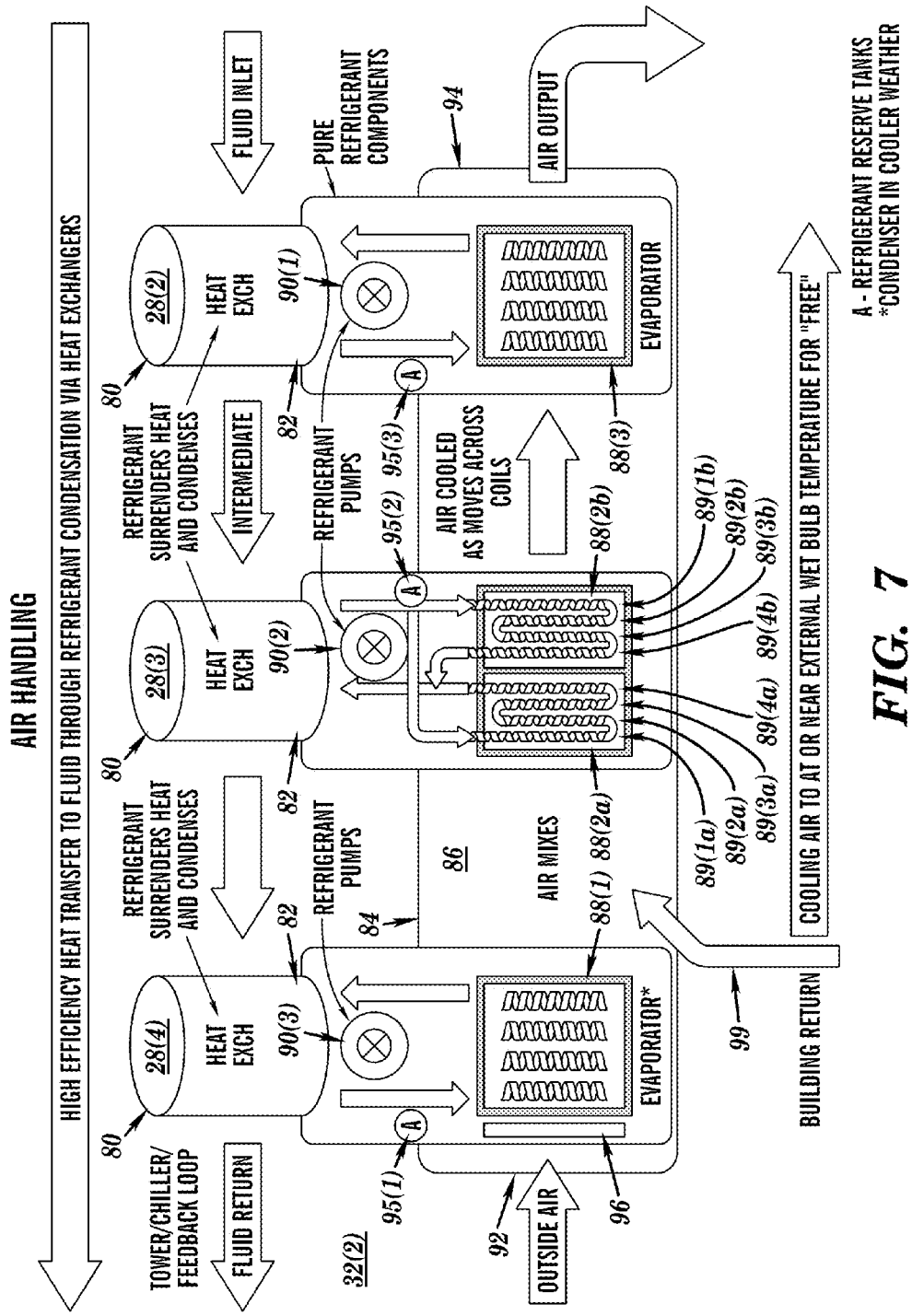
FIG. 7 is functional block diagram of another example of air handler apparatus.

Referring to FIG. 7, another example of air handler apparatus 32(2) is illustrated. In this example, the air handler apparatus 32(2) could be coupled in and replace the air handler apparatus 32(1) in the environment 10 shown in FIG. 1 and would operate in the same manner as the air handler apparatus 32(1) except as otherwise illustrated or described herein, although the air handler apparatus 32(2) may be used in other types of applications with other types of systems. Additionally, in this example the air handler apparatus 32(2) includes a plurality of heat exchanger devices 28(2)-28(4) each with a cooling fluid region 80 separated from a temperature transfer fluid region 82, an evaporator device 84 comprising an evaporator housing 86 and a plurality of evaporator coils 88(1)-88(3), reserve temperature transfer fluid tanks 95(1)-95(3), and pump 90(1)-90(3), although the air handler apparatus 32(2) could include other types and/or numbers of other systems, devices, components and/or other elements in other configurations.

The plurality of the heat exchanger devices 28(2)-28(4) each have one of the cooling fluid regions 80 which are configured to be coupled in series between a fluid supply return from and a fluid supply to the evaporative fluid cooling apparatus 12(1), although other types and/or numbers of heat exchanger devices in other configurations can be used. Each of the heat exchangers 28(2)-28(4) also has one of the temperature transfer fluid regions 82 which is separated from a corresponding one of the cooling fluid regions 80 and each is coupled to one of the evaporator coils 88(1)-88(3) as described in greater detail in the example below.

The evaporator device 84 includes the evaporator housing 86 which defines an air passage having an air input 92 and an air output 94, although the housing could define other types of passages and have other inputs and/or outputs. Additionally, the evaporator device 84 includes the plurality of evaporator coils 88(1)-88(3) which are arranged in series inside and along the evaporator housing 86 between the air input 92 and the air output 94, although other types and/or numbers of evaporator coils in other configurations may be used. Each of the plurality of evaporative coils 88(1)-88(3) has an output coupled to an input to one of the temperature transfer fluid regions 82 in one of the heat exchanger devices 28(2)-28(4) and an input coupled to an output from one of the temperature transfer fluid regions 82 in one of the heat exchanger devices 28(2)-28(4), although other configurations may be used.

In this particular example, one of the plurality of the heat exchanger devices 28(2) that has a cooling fluid input configured to be coupled to a cooling fluid return from the evaporative fluid cooling apparatus 12(1) is coupled to the one of the plurality of the evaporator coils 88(3) closest to the air output 94, although other coupling arrangements may be used. Additionally in this particular example, another one of the plurality of the heat exchanger devices 28(4) that has a cooling fluid output configured to be coupled to a cooling fluid supply to the evaporative fluid cooling apparatus 12(1) is coupled to the one of the plurality of the evaporator coils 88(1) closest to the air input, although other coupling arrangements may be used. Further in this particular example, one of the plurality of the heat exchanger devices 28(3) is coupled to an evaporator coil 88(2) comprising two evaporator coils 88(2a) and 88(2b) in a split counter flow design, although other types and/or numbers of evaporator coils could be used for evaporator coil 88(2), such as a single evaporator coil 88(1) or 88(3) by way of example only.

In this particular example, an output from the temperature transfer fluid region 82 in heat exchanger device 28(2) is split to an input located at the outermost portion or edges of each of the evaporator coils 88(2a) and 88(2b) (i.e. the outermost portions or edges of the evaporator coils 88(2a) and 88(2b) facing the air input 92 and air output 94, respectively) and an input back to the temperature transfer fluid region 82 is coupled to an innermost portion of each of the evaporator coils 88(2a) and 88(2b), (i.e. between or in this example near the center of the evaporator coils 88(2a) and 88(2b)), although the evaporator coils 88(2a) and 88(2b) can be coupled in other manners. With this split counter flow design, the temperature transfer fluid from the temperature transfer fluid region 82 of the heat exchanger devices 28(2) enters the outermost edges or portions of the evaporator coils 88(2a) and 88(2b) and flows into the middle where the evaporator coils 88(2a) and 88(2b) are joined thus creating a counter flow situation. Accordingly, with this counter flow design or inverse coupling this technology is able to more efficiently and effectively heat or cool the air passing through the evaporator housing 86. In this example the evaporator coil 88(2a) may comprise a plurality of first coil sections 89(1a)-89-4a) coupled in series in one of the regions and evaporator coil 88(2b) may comprise a plurality of first coil sections 89(1b)-89-4b) coupled in series in one of the regions. Each of the evaporator coils 88(1) and/or 88(3) may also be replaced by two or more coils, such as with evaporator coils 88(2a) and 88(2b) in a counter flow design by way of example only. Further, the pipes used to transfer the temperature transfer fluid from the temperature transfer fluid region 82 of the heat exchanger devices 28(2) has an electronically controlled valve 97 as does the piping which transfers the input back to the temperature transfer fluid region 82 also has an electronically controlled valve 97. These valves may be used to vary the flow of the temperature transfer fluid to each section of the evaporator coils 88(2a) and 88(2b), or even close off one or the other coil in case of a leak or for other reasons Each of pumps 90(1)-90(3) is coupled to pump temperature transfer fluid between one of the temperature transfer fluid regions 82 in the heat exchanger devices 28(2)-28(4) and one of the evaporator coils 88(1)-88(3) when activated, although each of the pumps 90(1)-90(3) may be coupled in other manners and locations. In this particular example, pump 90(2) coupled to the output from the temperature transfer fluid region 82 in heat exchanger device 28(3) before the split to the outermost portion or edge of each of the evaporator coils 88(2a) and 88(2b). Additionally, each of the pumps 90(1)-90(3) may be coupled to one or more of optional reserve temperature transfer fluid tanks 95(1)-95(3) from which additional temperature transfer fluid can be obtained or stored as needed. Further, each of the pumps 90(1)-90(3) may be coupled to and controlled by the evaporative cooler management computing device 60, although each may be controlled by other types of devices and/or in other manners, such as by manual engagement. The temperature transfer fluid in each of the temperature transfer fluid regions 82 in the heat exchanger devices 28(2)-28(4) may have a single or blended transfer fluid with different boiling points to enable more efficient and effective heating or cooling of the air.

An evaporator air movement device 96 may be positioned to provide a flow of the air from the air input 92 through the evaporator housing 86 and out the air output 94 when activated, although other manners for generating air flow may be used. In this particular example, the evaporator air movement device 96 may be coupled to and controlled by the evaporative cooler management computing device 60, although the evaporator air movement device 96 may be controlled by other types of devices and/or in other manners, such as by manual engagement. Further, an damping or controlling device may be positioned at the fresh air input 92 to control the amount of air moving across evaporator coil prior to be blended with the air input for returning air from the building as way of example 99 where the fresh air input 92 will blend with the return air input 99 prior to entering the evaporator coils 88(2a) and 88(2b).

The operation of the air handler apparatus 32(2) is the same as the operation of the air handler apparatus 32(1), except as illustrated and described herein. In this particular example, the heat exchanger devices 28(2)-28(4) in the air handler apparatus 32(2) each use a coolant or refrigerant fluid with a different boiling point than the others, although again other arrangements can be used. The air handler apparatus 32(2) may also have the refrigerant system 30 in the return air flow from the heat source 40 as shown in FIG. 1, although the air handler apparatus may have other types and/or numbers of other systems, devices, components and/or other elements in other configurations. As displayed in FIG. 7 air handler apparatus 32(2) may comprises multiple evaporator coils 88(1)-88(3) with both single flow, e.g. evaporator coils 88(1) and 88(3), and split counter flow, e.g. evaporator coils 88(2a)-88(2b) each with temperature transfer fluid designed to provide the most efficient preparation of air for use in a building or other destination, although again other types and/or numbers of coils in other configurations may be used.

In this particular example, fresh air may be introduced by the air movement device 96 when activated into the air input 92 in the evaporator housing 86 to fresh air to the first evaporator coil 88(1) in the air handler apparatus 32(2), although air or other fluids may be provided in other manners. By utilizing a fresh air intake, the air handler apparatus 32(2) helps to eliminate sick building syndrome (i.e. stale recirculating air in which fresh air is not introduced). The first evaporator coil 88(1) operates as a cooling coil (evaporator) for outside air in warm weather and also as a warming coil (condenser) to warm the cold fresh outside air without the use of energy from a pre-heat coil as in prior art.

Next, the fresh air mixes with the return air 99 and passes evaporator coils 88(2a)-88(2b) which in this particular example form a dual microchannel counter flow coil, although other coil designs could be used. This example of the evaporator coils 88(2a)-88(2b) allows the outside edge of coil 88(2a) which is closest to evaporator coil 88(1) to flood with temperature transfer fluid from the temperature transfer fluid region 82 of the heat exchanger devices 28(2) removing as much energy from the mixed air as it can. Next, as the ability of the temperature transfer fluid to absorb additional energy is reduced or lost the mixed air continues to pass into the forward edge of evaporator coil 88(2b), i.e. the edge or portion closest to evaporator coil 88(2a), where additional energy is absorbed cooling the mixed air prior to passing onto evaporator coil 88(3). The flooding of evaporator coil 88(2b) in the trailing edge, closest to evaporator coil 88(3) allows for maximum temperature transfer fluid contact time as the air leaves the evaporator coil 88(2b) to ensure maximum energy transfer has occurred. This counter flow arrangement allows for a doubling of the effective surface of this dual microchannel counter flow coil formed by evaporator coils 88(2a)-88(2b) thus overcoming the inherent limitations of the standard coil designs and allowing for maximum efficiency in the thinnest evaporator coil possible. This efficiency is further enhanced when a blended temperature transfer fluid is employed to allow for staging of energy absorption within the two evaporator coils 88(2a) and 88(2b), while returning the temperature transfer fluid reduces the components necessary to achieve this efficiency.

Next, the mixed air passes evaporator coil 88(3) before exiting the air output 94 which is coupled to the building or other destination for the treated air. Evaporator coil 88(3) receives the mixed air prior to its output 94 from the unit 32(2) to ensure the proper temperature has been achieved, thus the lowest energy air (coolest) of the evaporative coils thus should be required to do the least work, hence the counter flow of the air from input 92 to output 94 is opposite to the flow of cooled fluid from the heat rejection tower, allowing the coolest water from the tower output 16(2) to receive the heat from the coolest evaporator coil 88(3), then proceed to flow and absorb the heat energy from the first mixed air evaporator coil 88(2) and then this warmed fluid is available to either transfer the energy absorbed by the heat exchangers 28(2) and 28(3) into the temperature transfer fluid via heat exchanger 28(4) to evaporator coil 88(1) which will transfer that heat energy to cold fresh air acting as a condenser, warming it rather than employing a pre heat coil as in prior art, or evaporator coil 88(1) will absorb heat energy from the warm fresh air and transfer that energy through the temperature transfer fluid to heat exchanger 28(4) and further warm the fluid returning to the input of the tower 16(1) for heat rejection to the atmosphere. In cold weather this arrangement may employ all the heat energy absorbed via heat exchangers 28(2) and 28(3) to warm the fresh air through evaporative coil 88(1) thus removing any requirement for any heat rejection, achieving maximum efficiency since no heat energy is wasted.

Accordingly, this example of the air handler apparatus 32(2) should be substantially more efficient than the prior art due to the use of thinner refrigerant evaporator coils 88(1)-88(3) rather than the thick chilled water and pre heat coils employed with prior technologies. This more efficient design will also reduce the energy required by the air movement device 96 up to 30% to pull the air across the evaporator coils 88(1)-88(3) and reduce the energy needed to cool that air movement device 96 as well. Further, this example of the design prevents the risk of evaporator coil 88(1) freezing since this coil is refrigerant based and cannot freeze, further reducing the need for electrical heat to operate the air handler apparatus 32.

Accordingly, as illustrated and described by way of reference to the examples herein, this technology provides more effective and efficient air handler apparatuses for evaporative fluid cooling and methods. In particular, this technology provides air handler apparatuses which are able to assist evaporative fluid cooling apparatuses achieve a high delta T and a low flow rate, i.e. gallons per minute (GPM), that are able to easily avoid low delta syndrome. By way of example, this technology can provide a high delta T of between twenty degrees to forty-five degrees and also a low flow rate or gallons per minute. Additionally, with this high delta T and a low flow rate design, this technology is able to provide a significant reduction, i.e. often in excess of 50%, in the size and cost of piping and other parts when compared against prior cooling systems. Further, with this high delta T and a low flow rate design, this technology is able to output pure, non-saturated air and is able to utilize sprayer water that is chemical free. This technology also allows for a unique phased in integration of the compressor chiller that allow that compression chiller to operate at a greatly reduced lift compared to prior designs thereby lowering kW/ton relationship.

Having thus described the basic concept of this technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of this technology. Additionally, the recited order of processing elements or sequences, or the use of numbers, letters, or other designations therefore, is not intended to limit the claimed processes to any order except as may be specified in the claims. Accordingly, this technology is limited only by the following claims and equivalents thereto.

What is claimed is:

1. An air handler apparatus comprising:
   a plurality of heat exchanger devices coupled in series;
   a plurality of evaporator devices coupled in series;
   a fluid transfer system coupled to transfer temperature transfer fluid between the heat exchanger devices and the evaporator devices when activated;
   wherein a first one of the plurality of the heat exchanger devices coupled in series has a cooling fluid input configured to be coupled to a cooling fluid return from an evaporative fluid cooling apparatus is coupled to a last one of the plurality of the evaporator devices coupled in series that is closest to an air output; and
   wherein a last one of the plurality of the heat exchanger devices coupled in series has a cooling fluid output configured to be coupled to a cooling fluid supply to the evaporative fluid cooling apparatus is coupled to a first one of the plurality of the evaporator devices coupled in series that is closest to the air input.

2. A method for making an air handler apparatus, the method comprising:
   coupling a plurality of heat exchanger devices in series;
   coupling a plurality of evaporator devices in series;
   coupling a fluid transfer system coupled to transfer temperature transfer fluid between the heat exchanger devices and the evaporator devices when activated;
   wherein a first one of the plurality of the heat exchanger devices coupled in series has a cooling fluid input configured to be coupled to a cooling fluid return from an evaporative fluid cooling apparatus is coupled to a last one of the plurality of the evaporator devices coupled in series that is closest to an air output; and
   wherein a last one of the plurality of the heat exchanger devices coupled in series has a cooling fluid output configured to be coupled to a cooling fluid supply to the evaporative fluid cooling apparatus is coupled to a first one of the plurality of the evaporator devices coupled in series that is closest to the air input.

3. The apparatus as set forth in claim 1 wherein at least one of the evaporative devices comprises:
   an evaporator housing comprising at least two adjacent regions;
   an evaporator coil comprising at least two coils;
   one of the at least two coils comprising a plurality of first coil sections coupled in series in one of the regions, with an input to a first one of the plurality of first coil sections adjacent an outer edge of the one of the regions in the evaporator housing, an output from a last one of the plurality of first coil sections located in an interior portion of the evaporator housing; and
   another one of the at least two coils comprising a plurality of second coil sections coupled in series in another one of the regions, with an input to a first one of the plurality of second coil sections adjacent an outer edge of the one of the regions in the evaporator housing, an output from a last one of the plurality of second coil sections located in the interior portion of the evaporator housing.

4. The method as set forth in claim 2 wherein at least one of the plurality of evaporative devices further comprises:
   providing an evaporator housing comprising at least two adjacent regions and an evaporator coil comprising at least two coils;
   coupling one of a plurality of first coil sections for one of the at least two coils in series in one of the regions, with an input to a first one of the plurality of first coil sections adjacent an outer edge of the one of the regions in the evaporator housing, an output from a last one of the plurality of first coil sections located in an interior portion of the evaporator housing; and
   coupling another one of a plurality of second coil sections for another one of the at least two coils in series in one of the regions, with an input to a first one of the plurality of second coil sections adjacent an outer edge of the one of the regions in the evaporator housing, an output from a last one of the plurality of second coil sections located in the interior portion of the evaporator housing.

* * * * *